United States Patent
Chiu

(10) Patent No.: US 10,008,475 B2
(45) Date of Patent: Jun. 26, 2018

(54) STACKED-DIE INCLUDING A DIE IN A PACKAGE SUBSTRATE

(71) Applicant: Intel Corporation, Santa Clara, CA (US)

(72) Inventor: Chia-Pin Chiu, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days. days.

(21) Appl. No.: 13/629,368

(22) Filed: Sep. 27, 2012

(65) Prior Publication Data

US 2014/0084441 A1   Mar. 27, 2014

(51) Int. Cl.
*H01L 23/02* (2006.01)
*H01L 23/34* (2006.01)
(Continued)

(52) U.S. Cl.
CPC .......... *H01L 25/0657* (2013.01); *H01L 23/13* (2013.01); *H01L 23/36* (2013.01); *H01L 23/49816* (2013.01); *H01L 23/49827* (2013.01); *H01L 24/16* (2013.01); *H01L 2224/13111* (2013.01); *H01L 2224/16145* (2013.01);
(Continued)

(58) Field of Classification Search
CPC ....... H01L 25/0657; H01L 2924/01079; H01L 2924/01078; H01L 2924/14; H01L 2924/01013; H01L 2924/15311; H01L 2924/01029; H01L 2224/48091; H01L 2224/16; H01L 2224/48247; H01L 2224/73253; H01L 23/4334; H01L 23/13; H01L 23/36; H01L 23/49816

USPC ....... 257/777, 778, 786, 723, 686, 675, 706, 257/712, 713, E25.031, E25.032, 257/E23.042, E33.075, E31.131, E23.051, 257/E23.08, 692; 438/107, 108, 109, 438/110, 612, 666, 122, 123, 125
See application file for complete search history.

(56) References Cited

U.S. PATENT DOCUMENTS 5,095,404 A * 3/1992 Chao .............................. 361/700
5,977,640 A * 11/1999 Bertin ................. H01L 25/0657
257/686
(Continued)

FOREIGN PATENT DOCUMENTS

CN          1241032 A      1/2000
JP      H-08250652 A      9/1996
(Continued)

OTHER PUBLICATIONS

"International Application Serial No. PCTUS2013047826, International Search Report dated Sep. 30, 2013", 3 pgs.
(Continued)

*Primary Examiner* — Kimberly Rizkallah
*Assistant Examiner* — Dilinh Nguyen
(74) *Attorney, Agent, or Firm* — Schwegman Lundberg & Woessner, P.A.

(57) ABSTRACT

Some embodiments described herein include apparatuses and methods of forming such apparatuses. In one such embodiment, an apparatus may include a substrate, a first die, and a second die coupled to the first die and the substrate. The substrate may include an opening. At least a portion of the die may occupy at least a portion of the opening in the substrate. Other embodiments including additional apparatuses and methods are described.

21 Claims, 13 Drawing Sheets

(51) Int. Cl.

| | |
|---|---|
| *H01L 23/48* | (2006.01) |
| *H01L 23/52* | (2006.01) |
| *H01L 21/44* | (2006.01) |
| *H01L 21/48* | (2006.01) |
| *H01L 21/50* | (2006.01) |
| *H01L 25/065* | (2006.01) |
| *H01L 23/13* | (2006.01) |
| *H01L 23/36* | (2006.01) |
| *H01L 23/498* | (2006.01) |
| *H01L 23/00* | (2006.01) |

(52) U.S. Cl.
CPC ........ *H01L 2224/16225* (2013.01); *H01L 2224/16227* (2013.01); *H01L 2224/1703* (2013.01); *H01L 2224/17051* (2013.01); *H01L 2224/2929* (2013.01); *H01L 2224/29109* (2013.01); *H01L 2224/29339* (2013.01); *H01L 2224/32135* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2224/81191* (2013.01); *H01L 2224/81192* (2013.01); *H01L 2224/81815* (2013.01); *H01L 2225/06513* (2013.01); *H01L 2924/1515* (2013.01); *H01L 2924/15321* (2013.01); *H01L 2924/171* (2013.01)

(56) References Cited

U.S. PATENT DOCUMENTS

| | | | |
|---|---|---|---|
| 6,091,138 A | | 7/2000 | Yu et al. |
| 6,326,696 B1 * | | 12/2001 | Horton ............. H01L 23/49811 257/686 |
| 6,580,611 B1 | | 6/2003 | Vandentop et al. |
| 6,906,415 B2 * | | 6/2005 | Jiang et al. .................. 257/723 |
| 7,199,466 B2 | | 4/2007 | Chiu |
| 7,932,597 B2 | | 4/2011 | Terui et al. |
| 8,409,930 B2 | | 4/2013 | Terui et al. |
| 2004/0164390 A1 * | | 8/2004 | Wang .................... H01L 23/13 257/686 |
| 2004/0217485 A1 | | 11/2004 | Chung |
| 2005/0046039 A1 | | 3/2005 | Yang et al. |
| 2005/0104211 A1 | | 5/2005 | Baba |

FOREIGN PATENT DOCUMENTS

| | | |
|---|---|---|
| JP | 2001308258 A | 11/2001 |
| JP | 2008244104 A | 10/2008 |
| JP | 2015530757 A | 10/2015 |
| JP | 5984276 B2 | 9/2016 |
| WO | WO-2014051786 A1 | 4/2014 |

OTHER PUBLICATIONS

"International Application Serial No. PCTUS2013047826, Written Opinion dated Sep. 30, 2013", 5 pgs.

"International Application Serial No. PCT/US2013/047826, International Preliminary Report on Patentability dated Apr. 9, 2015", 7 pgs.

"Japanese Application Serial No. 2015-534476, Notice of Reasons for Rejection dated Feb. 23, 2016", (With English Translation), 5 pgs.

"Japanese Application Serial No. 2015-534476, Response filed May 11, 2016 to Notice of Reasons for Rejection dated Feb. 23, 2016", W/ English Translation of Claims, 18 pgs.

"Korean Application Serial No. 2015-7005116, Office Action dated Jun. 9, 2016", W/ English Translation, 16 pgs.

"Chinese Application Serial No. 201380045244.5, Office Action dated Jul. 20, 2017", w/Engiish Translation, 30 pgs.

"Chinese Application Serial No. 201380045244.5, Response filed Apr. 12, 2017 to Office Action dated Dec. 1, 2016", w/ English Claims, 16 pgs.

"Chinese Application Serial No. 201380045244.5, Response filed Sep. 27, 2017 to Office Action dated Jul. 20, 2017", w/ English Claims, 17 pgs.

* cited by examiner

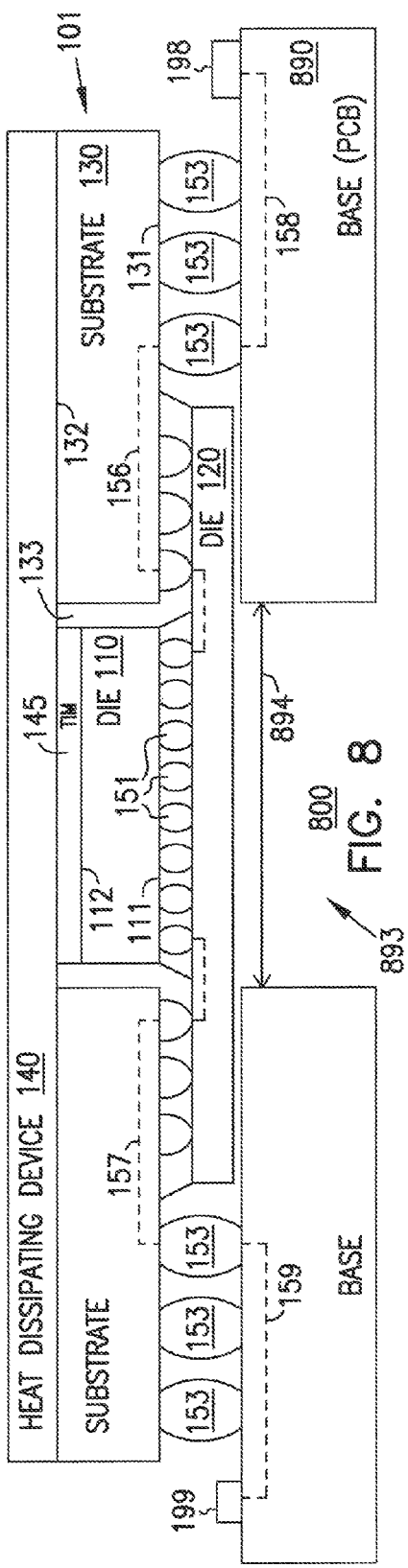
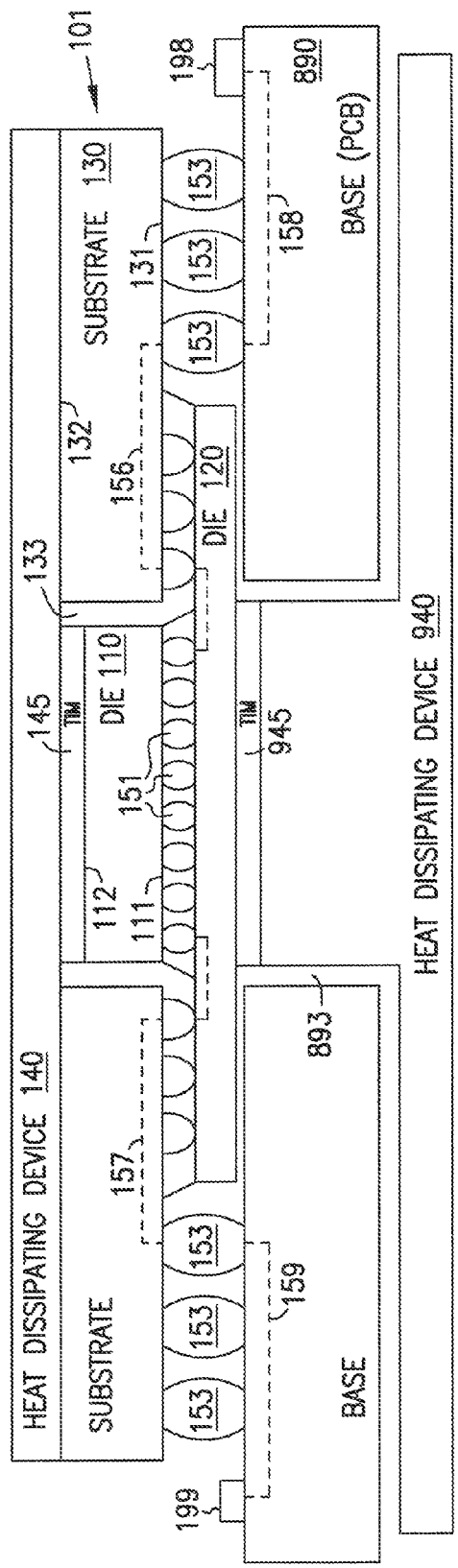

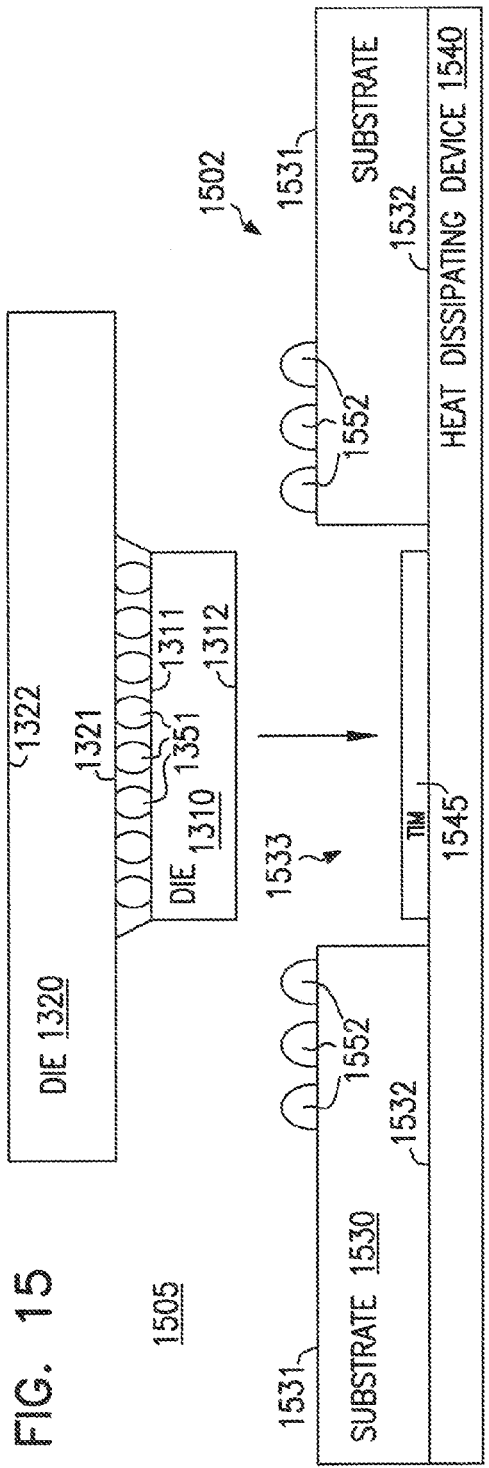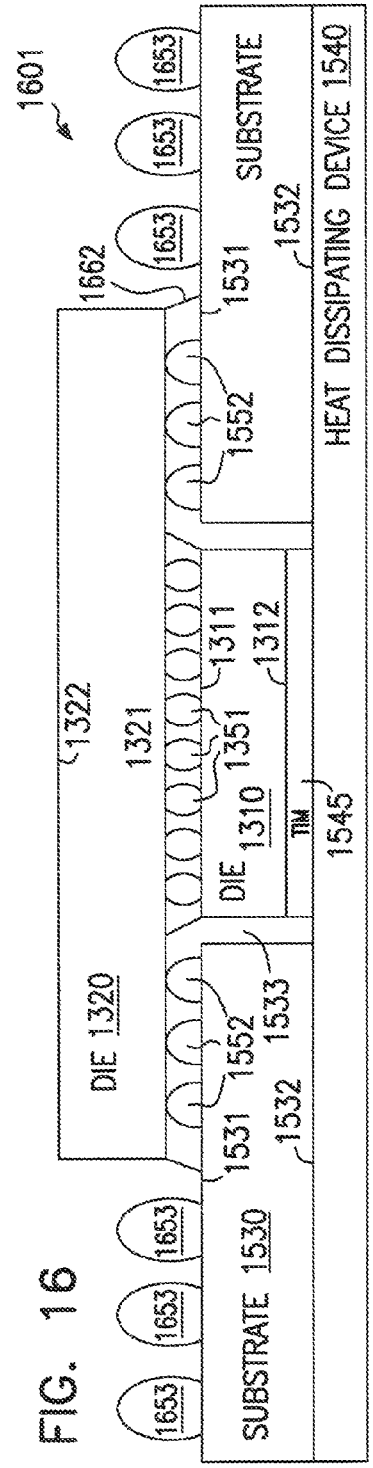

STACKED-DIE INCLUDING A DIE IN A PACKAGE SUBSTRATE

TECHNICAL FIELD

Embodiments pertain to semiconductor device packaging. Some embodiments relate to stacked-die packages.

BACKGROUND

Many electronic items, such as cellular phones, tablets, and computers, usually have a semiconductor die enclosed in an integrated circuit (IC) package. The die often has circuitry that may form a device, such as a memory device to store information or a processor to process information. The device in the die may generate heat when it operates. Thus, a thermal solution such as a heat sink is typically included in the IC package to cool the die.

Some conventional IC packages may have multiple dice in order to increase memory storage capacity, processing capability, or both. To save area in some IC packages, the multiple dice may be stacked on top of each other. Stacked-die, however, may increase the overall thickness of the IC package, causing it to be unsuitable for use in some electronic items. Further, providing adequate thermal solutions for some IC packages to cool the stacked-die may pose a challenge.

BRIEF DESCRIPTION OF THE DRAWINGS

FIG. 8 shows a cross section of an apparatus in the form of electronic equipment, which may be a variation of electrical equipment of FIG. 6, according to some embodiments described herein.

FIG. 9 shows a cross section of an apparatus in the form of electronic equipment of FIG. 8 including a heat dissipating device, according to some embodiments described herein.

FIG. 13 through FIG. 19 show methods of forming electronic equipments, according to some embodiments described herein.

DETAILED DESCRIPTION

Figure 1:
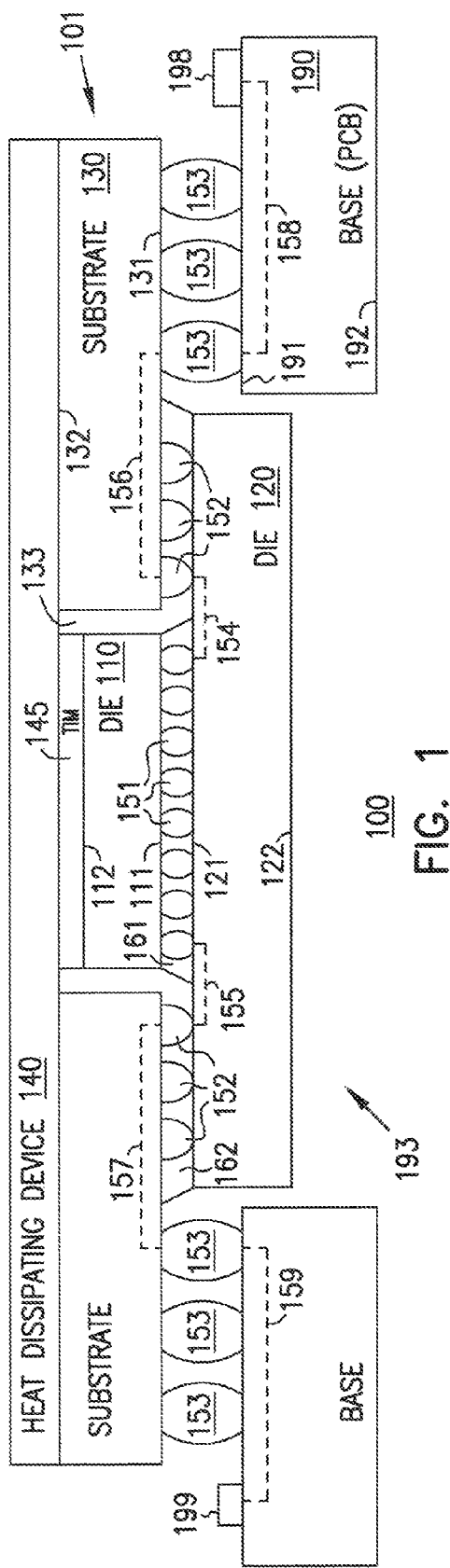
FIG. 1 shows a cross section of an apparatus in the form of electronic equipment including a package coupled to a base, according to some embodiments described herein.

FIG. 1 shows a cross section of an apparatus in the form of electronic equipment 100 including a package 101 coupled to a base 190, according to some embodiments described herein. Electronic equipment 100 may include or be included in electronic items such as cellular telephones, smart phones, tablets, e-readers (e.g., e-book readers), laptops, desktops, personal computers, servers, personal digital assistants (PDAs), web appliances, set-top boxes (STBs), network routers, network switches, network bridges, other types of devices or equipments.

Package 101 in FIG. 1 may include a ball grid array (BGA) type package or another type of package. Base 190 may include a circuit board, such as a printed circuit board (PCB). Package 101 may include a die 110, a die 120, a substrate 130, a heat dissipating device 140, and a thermal interface material (TIM) 145. Die 110 may be stacked over die 120 to form a stacked-die. Die 110 and 120 may be coupled to each other by electrical connections 151. Die 120 may be coupled to substrate 130 by electrical connections 152. Substrate 130 may be coupled to base 190 by electrical connections 153. Package 101 may include material 161 between die 110 and die 120 and material 162 between die 120 and substrate 130.

Electrical connections 151, 152, and 153 may include electrically conductive materials, such as solder or other electrically conductive materials. For example, electrical connections 151 and 152 may include Sn—Cu solder paste, Sn—Ag solder paste, Sn—Ag—Cu solder paste (e.g. SAC 305). Electrical connections 153 may include Sn—Ag—Cu solder paste (e.g. SAC 405, SAC 305). Materials 161 and 162 may include electrically non-conductive materials (e.g., underfill materials) such as epoxy or other electrically non-conductive materials. Heat dissipating device 140 may include metals (e.g., copper) or other materials. TIM 145 may include heat conducting material. Example materials for TIM 145 include polymer TIM, silver-filled epoxy, phase change material, thermal grease, indium solder, and other materials.

Substrate 130 may include an organic substrate, ceramic substrate, or another type of substrate. Substrate 130 may include a package substrate (e.g., a substrate in a BGA package). Substrate 130 may include internal conductive paths such as conductive paths 156 and 157, to allow electrical communication among components, such as among components 198 and 199 (coupled to base 190) and die 110 and die 120.

Substrate 130 includes a side (e.g., surface) 131 and a side (e.g., surface) 132 opposite from side 131. Substrate 130 may include an opening (e.g., a hole) 133. Conductive paths 156 and 157 may include vias filled with conductive materials (e.g., metals) that may be partially formed in substrate 130. As shown in FIG. 1, substrate 130 may include no conductive paths (e.g., no electrical vias) extending from side 131 to side 132 of substrate 130. Substrate 130 may include no active components (e.g., transistors).

Each of die 110 and 120 may include a semiconductor (e.g., silicon) die. Each of die 110 and die 120 may include circuitry (not shown in FIG. 1) that may form part of a device (or devices) to perform one or more functions, such as storing information, processing information, or other functions. For example, die 110 may include a memory device (e.g., including transistors, memory cells, and other components) to store information. The memory device may include a flash memory device, a dynamic random access memory (DRAM) device, a static random access memory (SRAM), or another type of memory device. In another example, die 120 may include a processor (e.g., including transistors, arithmetic logic units, and other components) that may include a central process unit (CPU), a graphics processing unit (GPU), or both. The processor may also include application specific integrated circuits (ASIC).

Die 110 and die 120 may include other combinations of devices. For example, die 110 may include a processor and die 120 may include a memory device. In another example, both die 110 and 120 may include either all processors or all memory devices.

As shown in FIG. 1, die 110 includes a side (e.g., surface) 111 and a side (e.g., surface) 112 opposite from side 111. Side 111 may be an active side of die 110 where electrical connections (e.g., electrical connections 151) are located. Side 112 may be a backside of die 110 where no electrical connections are located. Die 120 includes a side (e.g., surface) 121 and a side (e.g., surface) 122 opposite from side 121. Side 121 may be an active side of die 120 where electrical connections (e.g., 151) are located. Side 122 may be a backside of die 120 where no electrical connections are located.

Die 110 and 120 may be directly coupled (e.g., directly bonded) to each other in a face-to-face fashion, such that side 111 (e.g., active side) of die 110 and side 121 (e.g., active side) of die 120 may directly face each other. Electrical connections 151 may be directly coupled to die 110 and directly coupled to die 120, such that electrical connections 151 may be located directly between side 111 of die 110 and side 121 of die 120 and may directly contact sides 111 and 121. Electrical connections 152 may be directly coupled to die 120 and directly coupled to substrate 130, such that electrical connections 152 may be located directly between side 121 of die 120 and a side 131 of substrate 130 may directly contact sides 121 and 131. Electrical connections 151 (coupling die 120 to die 110) and electrical connections 152 (coupling die 120 to substrate 130) may be on the same side (e.g., side 121) of die 120. Electrical connections 152 (coupling substrate 130 to die 120) and electrical connections 153 (coupling substrate 130 to base 190) may be on the same side (e.g., side 131) of substrate 130.

As shown in FIG. 1, at least a portion of die 110 may be located inside (e.g., partially or completely embedded in) opening 133, such that at least a portion of die 110 may occupy at least a portion of opening 133. At least a portion of a die (e.g., die 110) refers to either only a portion of the die (e.g., only a portion of die 110) or the entire die (e.g., the entire die 110).

Die 120 may include no portions located inside opening 133 (e.g., the entire die 120 is outside opening 133). Therefore, no portions of die 120 may occupy any portion of opening 133.

Heat dissipating device 140 may be arranged to dissipate heat from package 101, such as to dissipate heat from die 110 or both of die 110 and die 120. Heat dissipating device 140 may include a heat spreader (e.g., an integrated heat spreader) or another type of thermal solution. Heat dissipating device 140 may be directly coupled to side 112 (e.g., backside) of die 110 by TIM 145. TIM 145 may enhance heat conduction (e.g., from die 110 to heat dissipating device 140) to further improve (e.g., increase) heat dissipation from die 110.

Heat dissipating device 140 may also be arranged to serve as a stiffener to improve the structure of package 101 (e.g., improve the structure of substrate 130). For example, as shown in FIG. 1, heat dissipating device 140 may be coupled (e.g., directly coupled) to side 132 of substrate 130. In some situations, such as when substrate 130 includes thin core substrate, a coreless substrate, or other relatively thin substrate, heat dissipating device 140 (as arranged in FIG. 1) may prevent (or reduce) warpage that may occur to substrate 130.

Base 190 includes a side (e.g., surface) 191 and a side (e.g., surface) 192 opposite from side 191. Base 190 may include components (e.g., components 198 and 199) such as capacitors, resistors, transistors, integrated circuit chips, or other electrical components coupled to it or formed thereon. FIG. 1 shows an example where components 198 and 199 are located on only one side (e.g., side 191) of base 190. Components 198 and 199, however, may be located on both sides (e.g., sides 191 and 192) of base 190. Base 190 may include an opening (e.g., a hole) 193.

Die 110 and die 120 may communicate (e.g., electrically communicate) with each other through electrical connections 151. Electrical connections 151 may carry information (e.g., in the form of electrical signals) communicated between the die 110 and die 120. The information may include data information, control information, power and ground, or other information. Die 110 may include no electrical conductive paths (e.g., through silicon vias (TSVs)) between sides 111 and 112. Thus, electrical communication to and from die 110 (e.g., between die 110 and die 120) may be carried through electrical connections (e.g., electrical connections 151) on only side 111 of die 110.

Die 120 and substrate 130 may communicate (e.g., electrically communicate) with each other through electrical connections 152. Electrical connections 152 may carry information (e.g., in the form of electrical signals) communicated between the die 120 and substrate 130. Die 120 may include no electrical conductive paths (e.g., TSVs) between sides 121 and 122. Thus, electrical communication to and from die 120 (e.g., between die 120 and die 110 and between die 120 and substrate 130) may be carried through electrical connections (e.g., electrical connections 151 and 152) on only side 121 of die 120.

Die 110 and die 120 may communicate (e.g., electrically communicate) with other components (e.g., components 198 and 199 coupled to base 190) through electrical connections 151, 152, and 153. For example, die 110 and die 120 may communicate with component 198 through one or more paths (e.g., signal paths) that may include electrical connections 151, conductive path 154, electrical connections 152, conductive path 156, electrical connections 153, and conductive path 158. In another example, die 110 and die 120 may communicate with a component 199 on base 190 through one or more paths (e.g., signal paths) that may include electrical connections 151, conductive path 155, electrical connections 152, conductive path 157, electrical connections 153, and conductive path 159.

Figure 2:
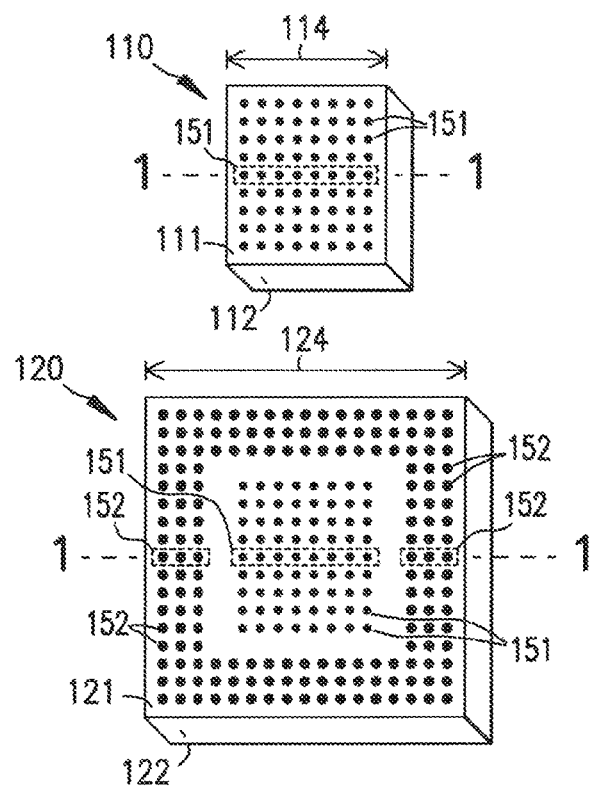
FIG. 2 shows dice after they are disassembled from the package of FIG. 1, according to some embodiments described herein.

FIG. 2 shows die 110 and 120 after they are disassembled from package 101 of FIG. 1. Lines 1-1 in FIG. 2 indicates locations of the cross sections of die 110 and 120 in FIG. 1. As shown in FIG. 2, die 110 may have a size (e.g., total surface area on side 111) less than the size (e.g., total surface area on side 121) of die 120. Die 110 includes a length 114. Die 120 includes a length 124, which may be greater than length 114 of die 110. A portion of electrical connections 151 may be on side 111 of die 110, and another portion of electrical connections 151 may be on side 121 of die 120. A portion of electrical connections 152 may also be on side 121 of die 120.

Figure 3:
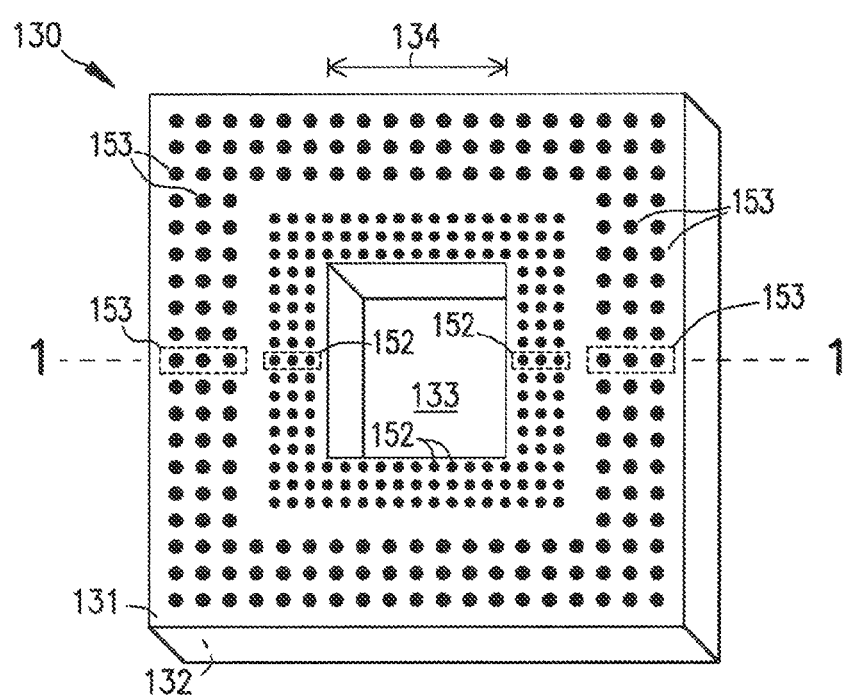
FIG. 3 shows a substrate after it is disassembled from the package of FIG. 1, according to some embodiments described herein.

FIG. 3 shows substrate 130 after it is disassembled from package 101 of FIG. 1. Line 1-1 in FIG. 3 indicates a location of the cross section of substrate 130 in FIG. 1. Opening 133 of substrate 130 includes a length 134, which may be greater than length 114 (FIG. 2) of die 110. As shown in FIG. 3, opening 133 may be part of a hole in a portion of substrate 130. A portion of electrical connections 152 and a portion of electrical connections 153 may be on side 131 of substrate 130.

Figure 4:
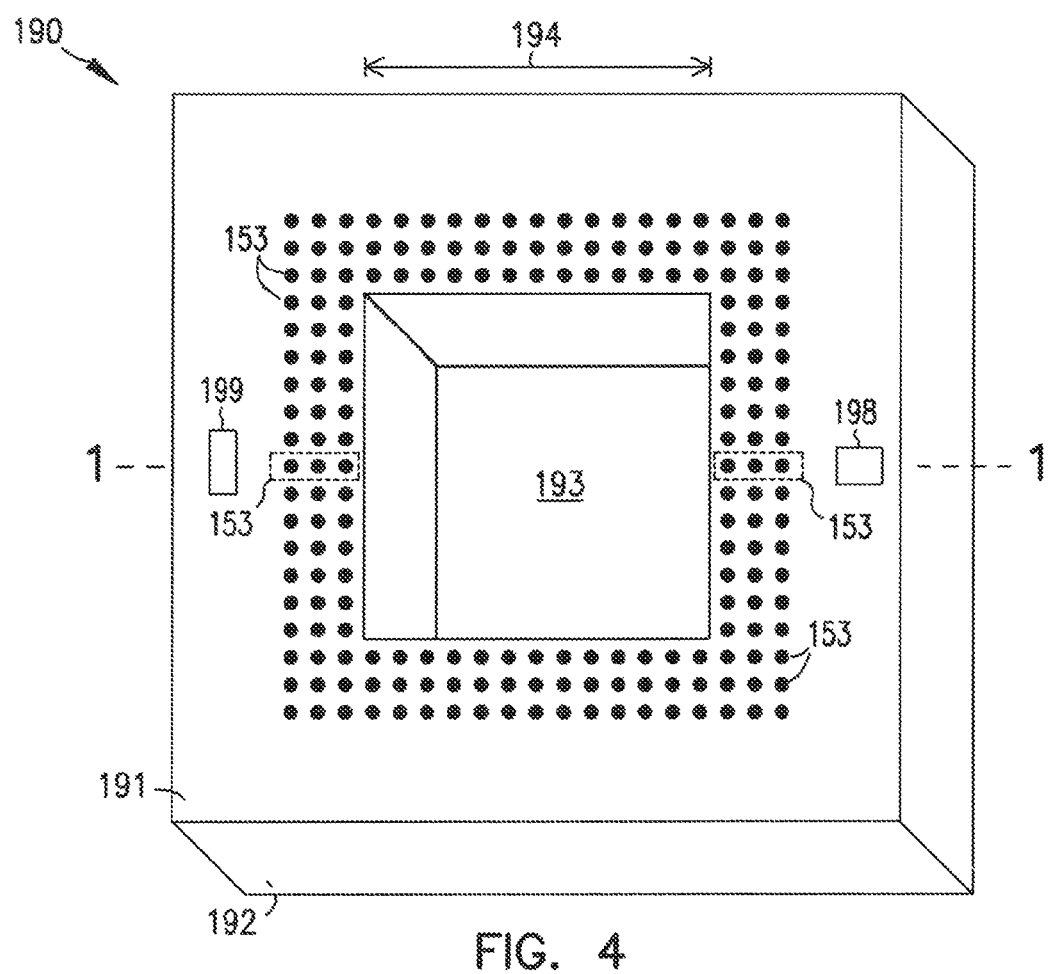
FIG. 4 shows a base after it is disassembled from the package of FIG. 1, according to some embodiments described herein.

FIG. 4 shows base 190 after it is disassembled from package 101 of FIG. 1. Line 1-1 in FIG. 4 indicates the location of the cross section of base 190 in FIG. 1. Opening 193 of base 190 includes a length 194, which may be greater than length 124 (FIG. 2) of die 120. As shown in FIG. 4, opening 193 may be part of a hole in a portion of base 190. A portion of electrical connections 153 may be on side 191 of base 190.

As shown in FIG. 1 and FIG. 3, including an opening (e.g., opening 133) in substrate 130 may allow for more options in the selection of the structure of die 110, die 120, or both of package 101. For example, with opening 133 in substrate 130, die 110, die 120 or both may be selected to be either a thin die (e.g., 50 nanometers (nm) or less in thickness) or a thick die (e.g., greater than 50 nm in thickness). Package 101 may allow a thick die to be included in it without impacting the profile (e.g., overall thickness) of package 101 because at least a portion of the die (e.g., die 110) may be inside opening 133 of substrate 130. This may improve (e.g., reduce) the profile of package 101 and may also improve (e.g., reduce) the overall thickness of electronic equipment 100. If a thick die (instead of a thin die) is included in package 101, cost may also be improved (e.g., reduced) because cost associated with a thick die may generally be lower than the cost associated with a thin die.

Including an opening (e.g., opening 193) in base 190 (FIG. 1 and FIG. 4) may further improve the profile (e.g., overall thickness) of electrical equipment 100. For example, with opening 193 in base 190, a die (e.g., die 120) of package 101 may also be a thick die without impacting the profile of electrical equipment 100 because at least a portion of the die (e.g., die 120) may be inside opening 193 of base 190.

Including an opening (e.g., opening 193) in base 190 may also allow for more options in the selection of additional types of thermal solution (besides heat dissipating device 140) for package 101, as described in more detail with reference to FIG. 5.

Figure 5:
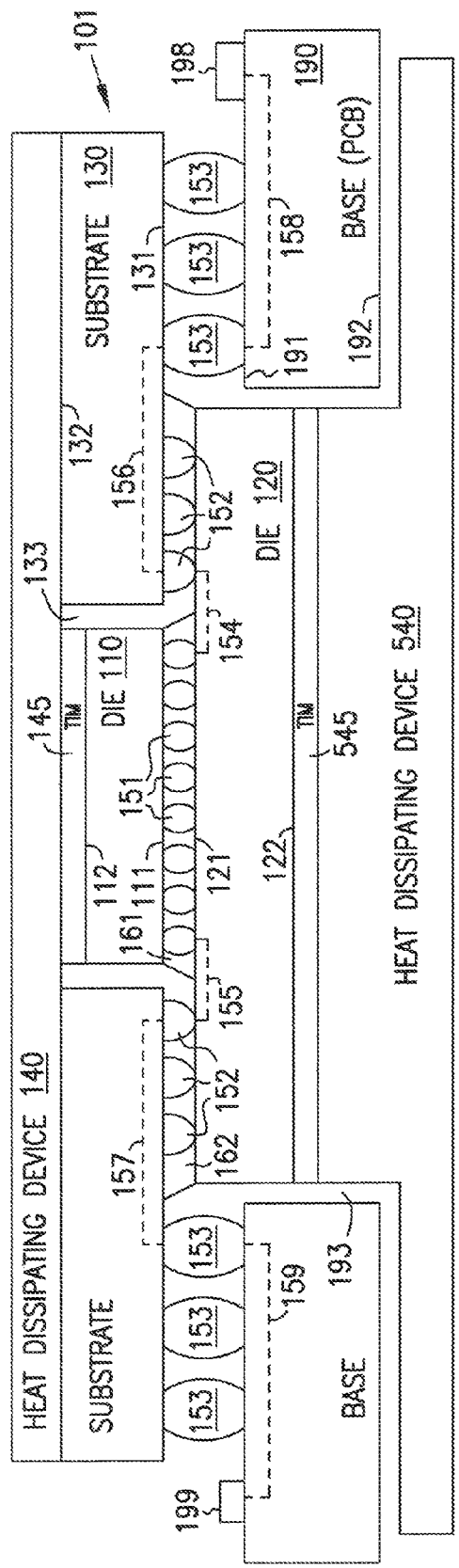
FIG. 5 shows a cross section of an apparatus in the form of electronic equipment including a heat dissipating device, according to some embodiments described herein.

FIG. 5 shows a cross section of an apparatus in the form of electronic equipment 500 including a heat dissipating device 540, according to some embodiments described herein. Electronic equipment 500 may include elements similar to or identical to those of electronic equipment 100 (FIG. 1). Thus, for simplicity, the description of similar or identical elements between FIG. 1 and FIG. 5 is not repeated in the description FIG. 5. Differences between electronic equipment 100 (FIG. 1) and electronic equipment 500 (FIG. 5) include heat dissipating device 540 and TIM 545 in electronic equipment 500.

Heat dissipating device 540 may be arranged to dissipate heat from package 101, such as to dissipate heat from die 120 or both of die 110 and die 120. Heat dissipating device 540 may include a heat spreader (e.g., an integrated heat spreader) or another type of thermal solution. As shown in FIG. 5, heat dissipating device 540 may be directly coupled to side 122 of die 120 by a thermal interface material (TIM) 545. TIM 545 may enhance heat conduction (e.g., from die 120 to heat dissipating device 540) to further improve (e.g., increase) heat dissipation from die 120.

Besides heat dissipating device 140 (e.g., on top of package 101), heat dissipating device 540 (at the bottom of package 101) may further improve thermal solutions for package 101. For example, in some situations, hot spots may occur in die 120 (e.g., at the bottom portion near side 122 of die 120) if heat dissipating device 540 is not included package 101. Coupling heat dissipating device 540 to die 120 as shown in FIG. 5 may eliminate or reduce such hot spots. This may further improve thermal solutions in package 101.

Figure 6:
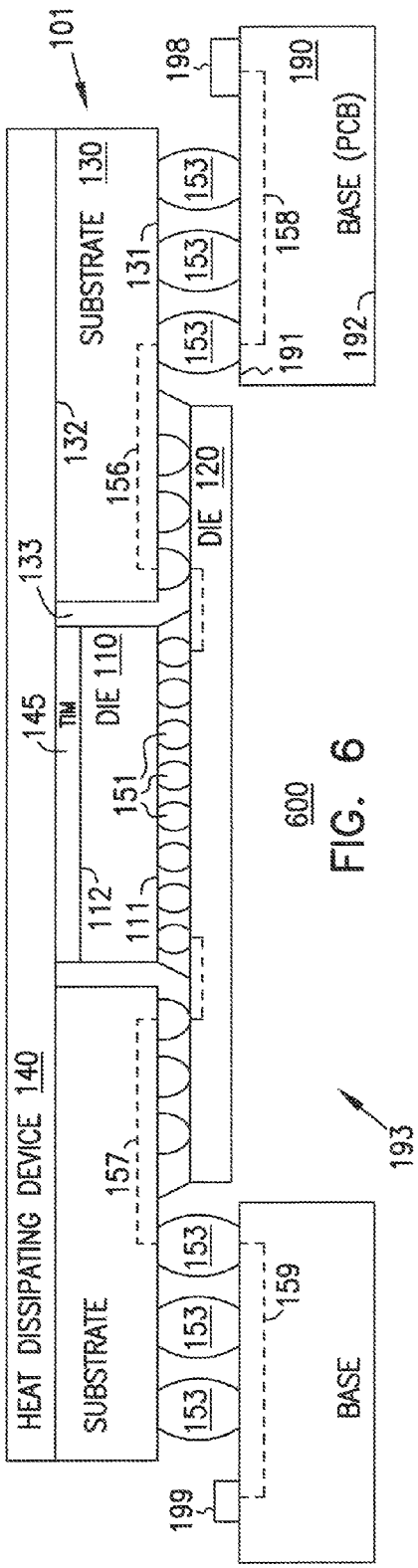
FIG. 6 shows a cross section of an apparatus in the form of electronic equipment, which may be a variation of the electronic equipment of FIG. 1, according to some embodiments described herein.

FIG. 6 shows a cross section of an apparatus in the form of electronic equipment 600, which may be a variation of electronic equipment 100 of FIG. 1, according to some embodiments described herein. Electronic equipment 600 may include elements similar to or identical to those of electronic equipment 100 (FIG. 1). Thus, for simplicity, the description of similar or identical elements between FIG. 1 and FIG. 6 is not repeated in the description FIG. 6. Differences between electronic equipment 100 (FIG. 1) and electronic equipment 600 (FIG. 6) include the arrangement of die 120 and opening 193 of base 190. As shown in FIG. 6, die 120 may include no portions located inside opening 193 of substrate 130 (e.g., the entire die 120 is outside opening 193). Thus, no portions of die 120 may occupy any portion of opening 193 of substrate 130.

Figure 7:
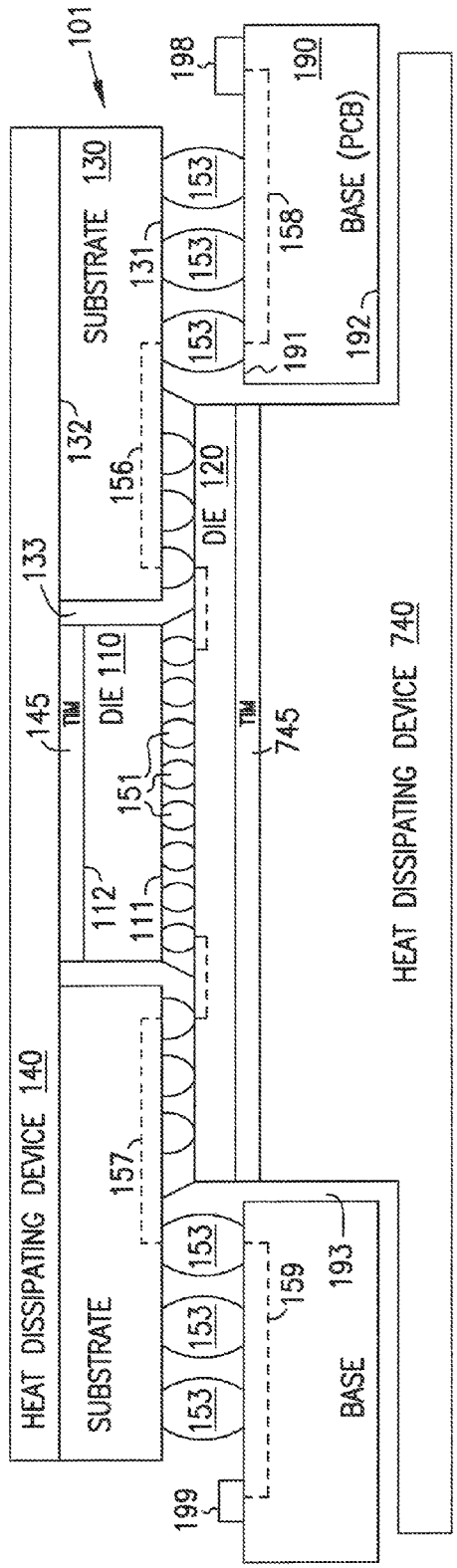
FIG. 7 shows a cross section of an apparatus in the form of electronic equipment of FIG. 6 including a heat dissipating device, according to some embodiments described herein.

FIG. 7 shows a cross section of an apparatus in the form of electronic equipment 700 including a heat dissipating device 740, according to some embodiments described herein. Electronic equipment 700 may include elements similar to or identical to those of electronic equipment 600 (FIG. 6). Thus, for simplicity, the description of similar or identical elements between FIG. 6 and FIG. 7 is not repeated in the description FIG. 7. Differences between electronic equipment 600 (FIG. 6) and electronic equipment 700 (FIG. 7) include the addition of heat dissipating device 740 and TIM 745 in electronic equipment 700. Heat dissipating device 740 may be arranged to dissipate heat from package 101, such as to dissipate heat from die 120 or both of die 110 and die 120.

FIG. 8 shows a cross section of an apparatus in the form of electronic equipment 800, which may be a variation of electrical equipment 600 of FIG. 6, according to some embodiments described herein. Electronic equipment 800 may include elements similar to or identical to those of electronic equipment 600 (FIG. 6). Thus, for simplicity, the description of similar or identical elements between FIG. 6 and FIG. 8 is not repeated in the description FIG. 8. Differences between electronic equipment 600 (FIG. 6) and electronic equipment 800 (FIG. 8) include differences between a length 894 of opening 893 of base 890 and length 124 (FIG. 2) of die 120. Length 894 of opening 893 may be less than length 124 of die 120. Thus, as shown in FIG. 5, opening 893 of base 890 may directly face only a portion of side 122 of die 120 (e.g., opening 893 does not face the entire side 122 of die 120). In FIG. 1, opening 193 may directly face the entire side 122 of die 120.

FIG. 9 shows a cross section of an apparatus in the form of electronic equipment 900 including a heat dissipating device 940, according to some embodiments described herein. Electronic equipment 900 may include elements similar to or identical to those of electronic equipment 800 (FIG. 8). Thus, for simplicity, the description of similar or identical elements between FIG. 8 and FIG. 9 is not repeated in the description FIG. 9. Differences between electronic equipment 800 (FIG. 8) and electronic equipment 900 (FIG. 9) include the addition of heat dissipating device 940 and TIM 945 in electronic equipment 900. Heat dissipating device 940 may be arranged to dissipate heat from package 101, such as to dissipate heat from die 120 or both of die 110 and die 120.

Figure 10:
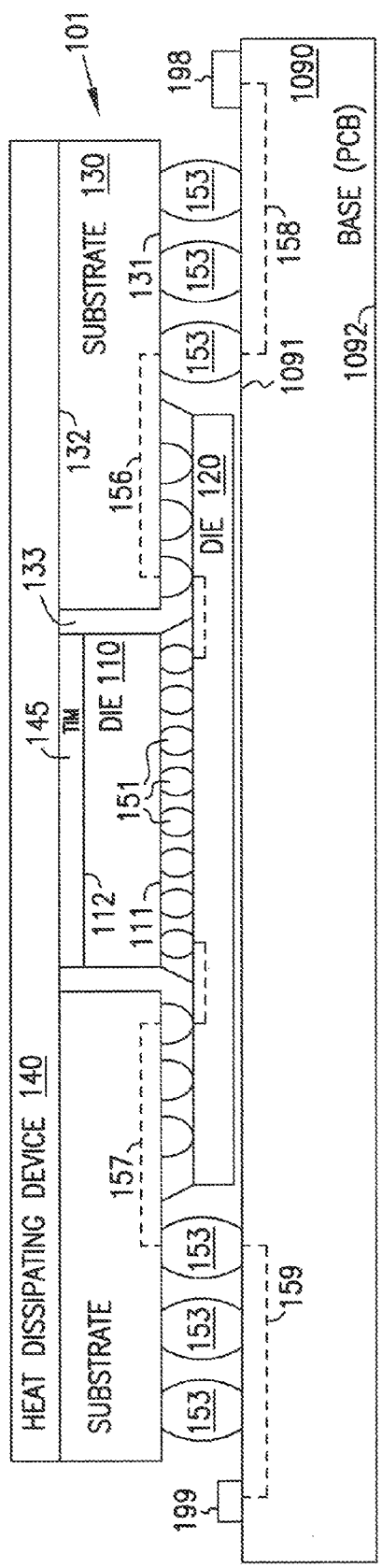
FIG. 10 shows a cross section of an apparatus in the form of electronic equipment including a package coupled to a base having no openings, according to some embodiments described herein.

FIG. 10 shows a cross section of an apparatus in the form of electronic equipment 1000 including a package 101 coupled to a base 1090 having no openings, according to some embodiments described herein. Electronic equipment 1000 may include elements similar to or identical to those of electronic equipment 100 (FIG. 1). Thus, for simplicity, the description of similar or identical elements between FIG. 1 and FIG. 10 is not repeated in the description FIG. 10. Differences between electronic equipment 100 (FIG. 1) and electronic equipment 1000 (FIG. 10) include differences in base 190 (FIG. 1) and base 1090 (FIG. 10). As shown in FIG. 10, base 1090 may include no openings facing die 120. Without openings in base 1090, die 120 may include a thin die.

Figure 11:
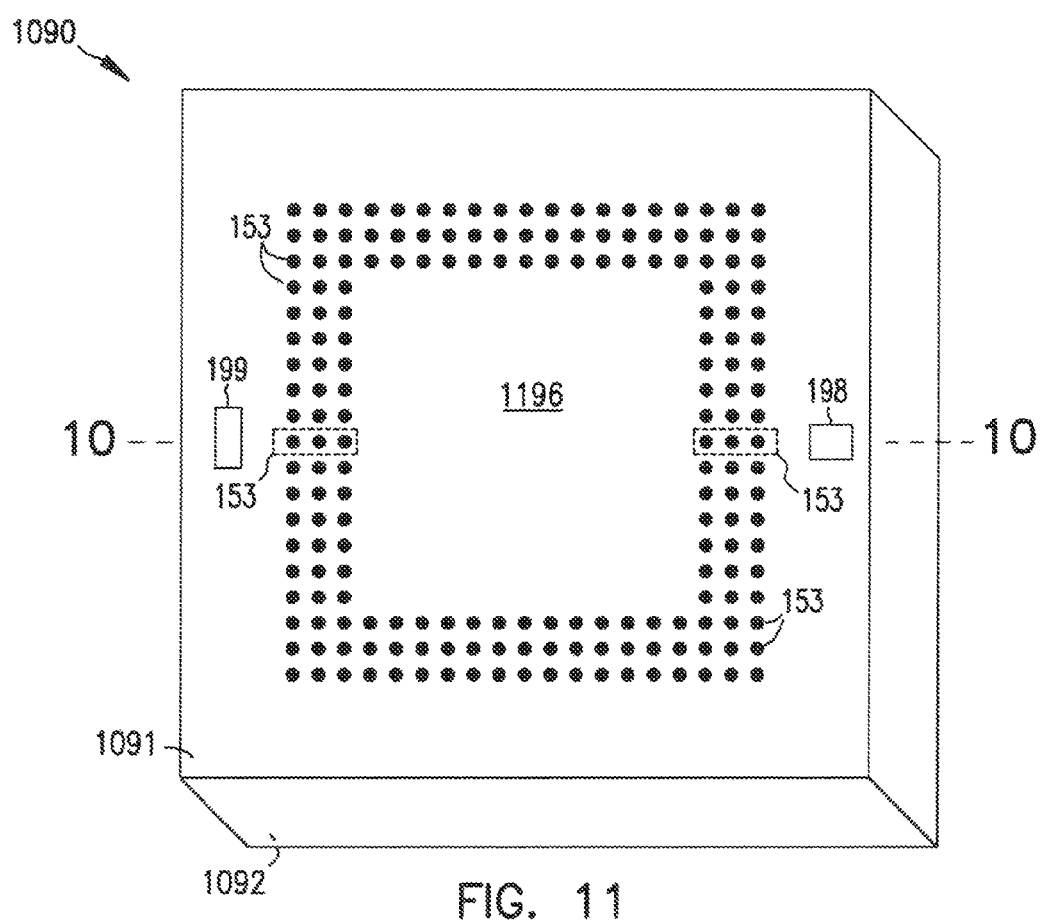
FIG. 11 shows a base after it is disassembled from the package of FIG. 10, according to some embodiments described herein.

FIG. 11 shows base 1090 of FIG. 10 after it is disassembled from package 101 (FIG. 10). Line 10-10 in FIG. 11 indicates a location of the cross section of base 1090 in FIG. 10. As shown in FIG. 11, base 1090 may include no openings at portion 1196 that faces die 120 (FIG. 10).

In the above description with respect to FIG. 1 through FIG. 11, each of electronic equipments 100, 500, 600, 700, 800, 900, and 1000 may include a top die (e.g., die 110) coupled to a bottom die (e.g., die 120). However, in some arrangements, the bottom die (e.g., die 120) may be replaced by a structure different from a die (e.g., a structure that does not include a die). For example, in some arrangements, an interposer may replace die 120.

Figure 12:
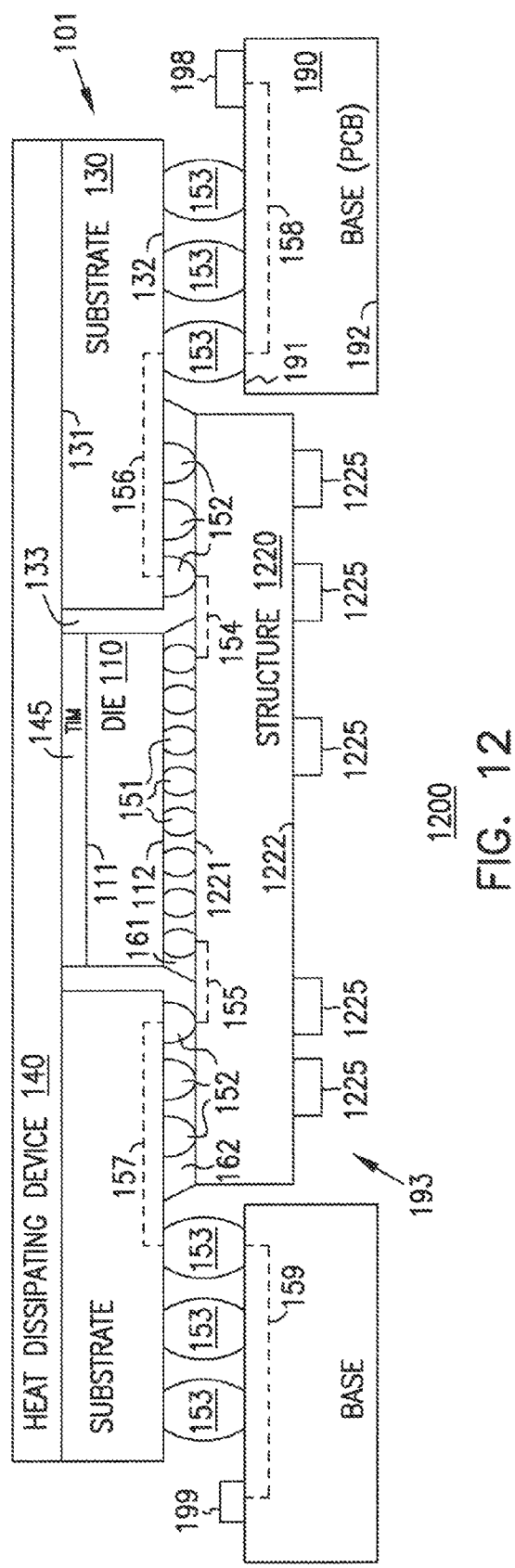
FIG. 12 shows a cross section of an apparatus in the form of electronic equipment including a package having a structure coupled to a die, according to some embodiments described herein.

FIG. 12 shows a cross section of an apparatus in the form of electronic equipment 1200 including a package 101 having a structure 1220 coupled to die 110, according to some embodiments described herein. Electronic equipment 1200 may include elements similar to or identical to those of electronic equipment 100 (FIG. 1). Thus, for simplicity, the description of similar or identical elements between FIG. 1 and FIG. 12 is not repeated in the description FIG. 12.

As shown in FIG. 12, structure 1220 includes a side 1221 and a side 1222 opposite from side 1221. Structure 1220 may include an interposer or another type of structure having conductive paths to provide communication between die 110 to other components (e.g., components 198 and 199). Structure 1220 may include components 1225 (e.g., passive components) such as capacitors, inductors, resistors, and other passive components. Structure 1220 may include no active components, such as transistors. FIG. 12 shows components 1225 being located on side 1222 of structure 1220 as an example. However, some or all of components 1225 may be inside structure 1220. In an alternative arrangement, structure 1220 may be replaced by a die (or alternatively may include a die), such as die 120 described above with reference to FIG. 1 through FIG. 11.

FIG. 13 through FIG. 19 show methods of forming electronic equipments, according to some embodiments described herein. The electronic equipments formed by the methods described below with reference to FIG. 13 through FIG. 19 may include the electronic equipments (e.g., 100, 500, 600, 700, 800, 900, 1000, and 1200) described above with reference to FIG. 1 through FIG. 12.

Figure 13:
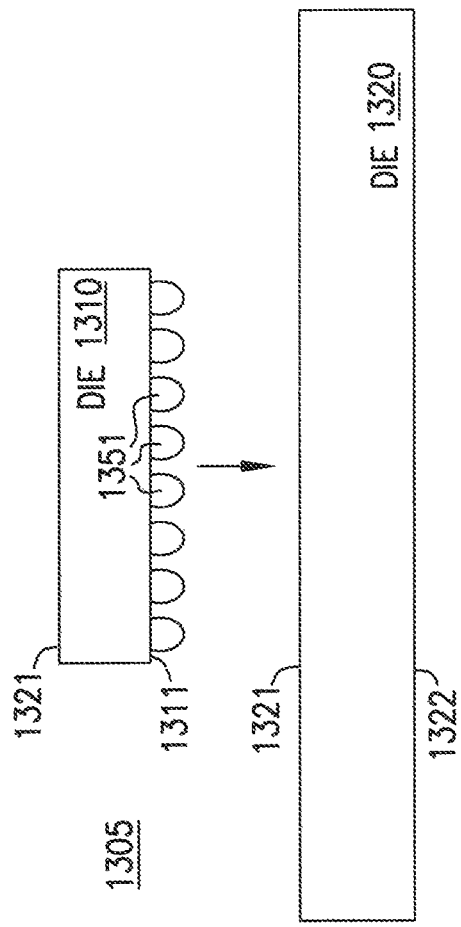

As shown in FIG. 13, method 1305 may include attaching die 1310 to die 1320. Die 1310 and die 1320 may correspond to die 110 and die 120, respectively, of FIG. 1 through FIG. 11. Alternatively, die 1320 in FIG. 13 may be replaced by a structure, such as structure 1220 of FIG. 12. In FIG. 13, die 1310 includes a side 1311 (e.g., active side) and side a 1312 (e.g., backside) opposite from side 1311. Sides 1311 and 1312 may include an active side and a backside, respectively, of die 1310. Die 1320 includes a side (e.g., surface) 1321 and a side (e.g., surface) 1322 opposite from side 1321. Sides 1321 and 1322 may include an active side and a backside, respectively, of die 1320. Side 1311 of die 1310 may include electrical connections (e.g., solder balls, solder bumps, or another type of conductive connection) 1351 formed thereon. Although not shown in FIG. 13, side 1321 of die 1320 may include electrical connections (e.g., conductive pads) formed thereon and to be bonded to electrical connections 1351 of die 1310. Die 1310 and die 1320 may be attached to each other (e.g., by flip chip technique), such that electrical connections 1351 of die 1310 may be bonded to corresponding electrical connections of die 1320 and form a controlled collapse chip connection (C4).

In FIG. 13, attaching die 1310 to die 1320 in method 1305 may include arranging die 1310 and 1320 in face-to-face position, such that side 1311 of die 1310 may directly face side 1321 of die 1320. Attaching die 1310 to die 1320 may also include positioning (e.g., aligning) electrical connections 1351 of die 1310 in direct contact with corresponding electrical connections on side 1321 of die 1320. Then, a reflow process (e.g., reflow soldering process) may be performed to bond electrical connections 1351 of die 1310 to corresponding electrical connections of die 1320.

Figure 14:
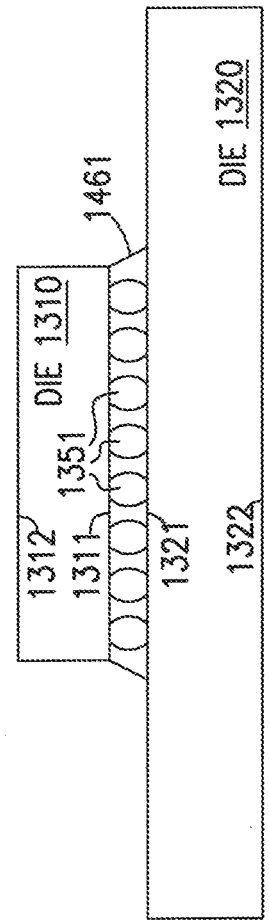

FIG. 14 shows a combination (e.g., stacked-die) including die 1310 and 1320 after they have been attached (e.g., bonded) to each other. Electrical connections 1351 between die 1310 and die 1320 may correspond to electrical connections 151 (e.g., FIG. 1). As shown in FIG. 14, material (e.g., underfill material) 1461 may be formed between die 1310 and die 1320 and around electrical connections 1351.

FIG. 15 shows a method 1505 of attaching the combination of die 1310 and die 1320 to an assembly 1502, according to some embodiments described herein. The combination of die 1310 and die 1320 of FIG. 14 may be flipped over (as shown in FIG. 15) before attaching to assembly 1502. Assembly 1502 may include components such as a substrate 1530 coupled to a heat dissipating device 1540 and a TIM 1545. These components may be pre-attached before assembly 1502 is attached to the combination of die 1310 and die 1320. Substrate 1530 of assembly 1502 includes a side (e.g., surface) 1531 and a side (e.g., surface) 1532 opposite from side 1531. Side 1531 may include electrical connections (e.g., solder balls, solder bumps, or another type of conductive connection) 1552 formed thereon. Substrate 1530 may include an opening 1533. Substrate 1530 may correspond to substrate 130 (e.g., FIG. 1). Thus, opening 1533 of substrate 1530 may correspond to opening 133 of substrate 130.

In FIG. 15, attaching the combination of die 1310 and die 1320 to assembly 1502 in method 1505 may include positioning (e.g., aligning) die 1310 directly over opening 1533 of substrate 1530, such that after the combination of die 1310 and die 1320 is attached to assembly 1502, at least a portion of die 1310 may be located inside opening 1533 of substrate 1530 to occupy at least a portion of opening 1533.

Attaching the combination of die 1310 and die 1320 to assembly 1502 may also include positioning (e.g., aligning) electrical connections 1552 of substrate 1530 in direct contact with corresponding electrical connections (not shown) on side 1321 of die 1320. Then, a reflow process (e.g., reflow soldering process) may be performed to bond electrical connections 1352 of substrate 1530 to corresponding electrical connections side 1321 of die 1320 to form a connection (e.g., controlled collapse chip connection) between die 1320 and substrate 1530.

FIG. 16 shows a package 1601 after the combination of die 1310 and 1320 have been attached (e.g., bonded) to assembly 1502 (FIG. 15). As shown in FIG. 16, material (e.g., underfill material) 1662 may be formed between die 1320 and substrate 1530 and around electrical connections 1552.

Package 1601 may correspond to package 101 (e.g., FIG. 1) described above with reference to FIG. 1 through FIG. 12. In FIG. 16, electrical connections 1552 between substrate 1530 and die 1320 may correspond to electrical connections 152 (e.g., FIG. 1). As shown in FIG. 16, package 1601 may include electrical connections 1653 formed on side 1531 of substrate 1530. Electrical connections 1653 may be formed after the combination of die 1310 and 1320 have been attached to assembly 1502 (FIG. 15). Electrical connections 1653 may include solder balls or another type of conductive connection. Electrical connections 1653 may enable package 1601 to be electrically coupled to other components (e.g., to a circuit board (e.g., PCB) of electronic equipment.

Figure 17:
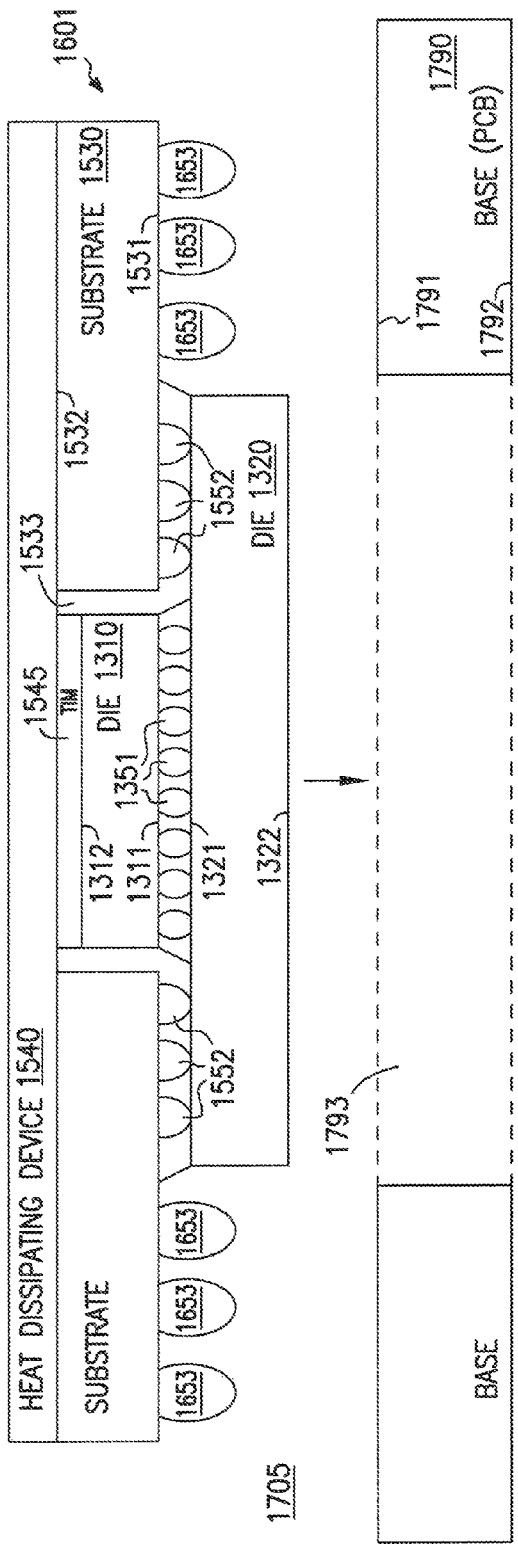

FIG. 17 shows a method 1705 of attaching package 1601 of FIG. 16 to a base 1790, according to some embodiments described herein. Package 1601 of FIG. 16 may be flipped over (as shown in FIG. 17) before attaching to base 1790 (e.g., by surface mounting technique). As shown in FIG. 17, base 1790 includes a side (e.g., surface) 1791 and side (e.g., surface) 1792 opposite from side 1791. Base 1790 may include an opening 1793. Base 1790 may correspond to base 190 (e.g., FIG. 1 and FIG. 4). Thus, opening 1793 of base 1790 may be similar to or identical to opening 193 of base 190.

In FIG. 17, attaching package 1601 to base 1790 in method 1705 may include positioning (e.g., aligning) die 1320 directly over opening 1793 of base 1790, such that after package 1601 is attached to base 1790, at least a portion of die 1320 may be located inside opening 1793 of base 1790 to occupy at least a portion of opening 1793.

Attaching package 1601 to base 1790 in method 1705 may also include positioning (e.g., aligning) electrical connections 1653 of substrate 1530 in direct contact with corresponding electrical connections (not shown) on side 1791 of base 1790. Then, a reflow process (e.g., reflow soldering process) may be performed to bond electrical connections 1653 of substrate 1530 to corresponding electrical connections on side 1791 of base 1790.

Figure 18:
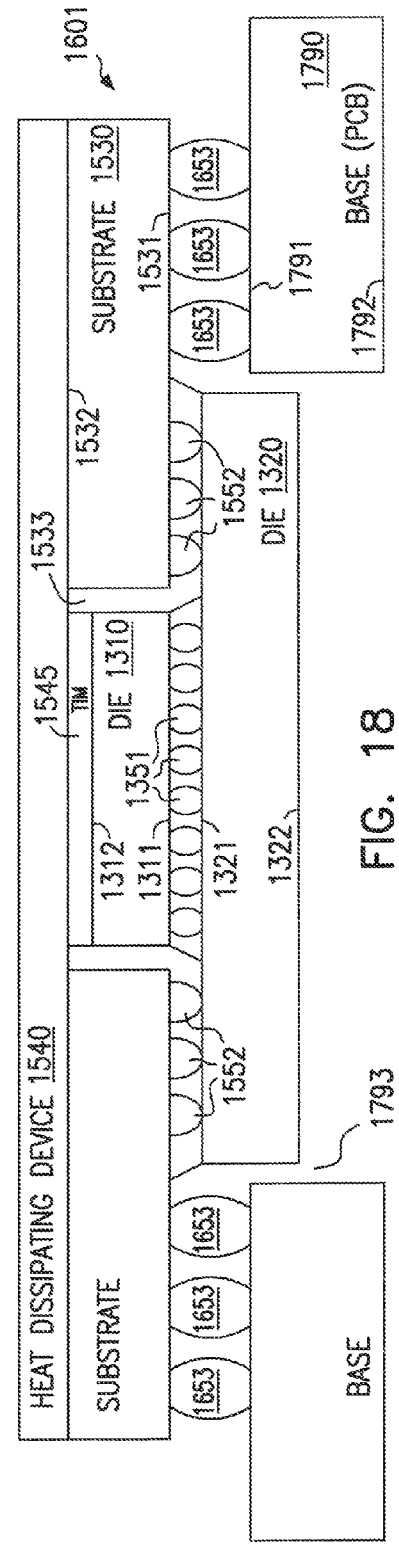

FIG. 18 shows package 1601 after it has been attached (e.g., bonded) to base 1790. Electrical connections 1653 between substrate 1530 and base 1790 may correspond to electrical connections 153 (e.g., FIG. 1).

The above description with respect to method 1705 of FIG. 17 and FIG. 18 shows an example where method 1705 may attach package 1601 to base 1790 such that at least a portion of die 1320 may be located inside opening 1793 of base 1790 (FIG. 18). In an alternative method, package 1601 may be attached to base 1790 such that no portions of die 1320 may occupy any portion of opening 1793 (e.g., the entire die 1320 is outside opening 1793). The arrangement of die 1320 and base 1790 (FIG. 17) in such an alternative method may be similar to or identical to the arrangement of die 120 and base 190 shown in FIG. 6. In another alternative method, opening 1793 (FIG. 17) of base 1790 may have a dimension (e.g., a length similar to length 894 in FIG. 8), such that the arrangement of die 1320 and base 1790 (FIG. 17) may be similar to or identical to the arrangement of die 120 and base 890 shown in FIG. 8.

The above description with respect to method 1705 of FIG. 17 and FIG. 18 show an example where method 1705 may use a base (e.g., base 1790) having an opening (e.g., opening 1793). In an alternative method, a base without an opening may be used. In such an alternative method, the arrangement of die 1320 and the base (without openings) may be similar to or identical to the arrangement of die 120 and base 1090 of FIG. 10.

Figure 19:
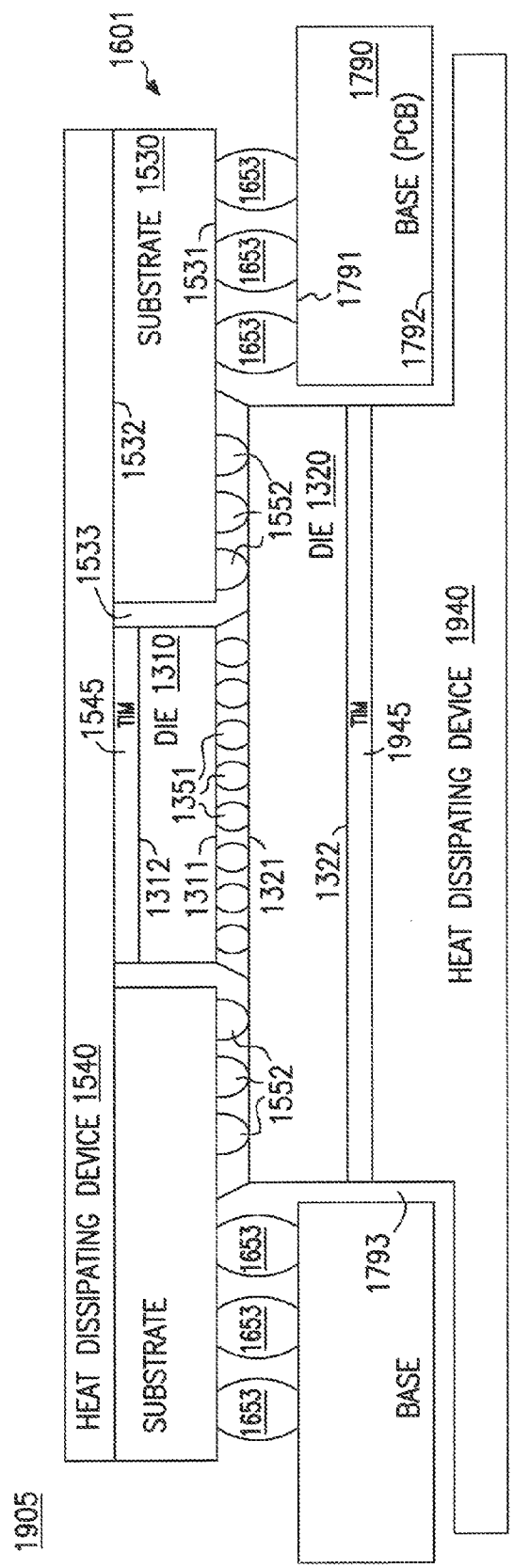

FIG. 19 shows a method 1905 of attaching a heat dissipating device 1940 to die 1320 of package 1601 of FIG. 18, according to some embodiments described herein. Heat dissipating device 1940 may correspond to heat dissipating device 540 (FIG. 5). In FIG. 19, method 1905 may include attaching a TIM 1945 to die 1320 such that TIM 1945 is between die 1320 and heat dissipating device 1940. TIM 1945 may correspond to TIM 545 (FIG. 5).

Method 1905 may use a heat dissipating device and a TIM different from those shown in FIG. 19. For example, if the arrangement of die 1320 and base 1790 is similar to or identical to the arrangement of die 120 and base 190 of FIG. 6, then method 1905 may use a heat dissipating device similar to identical to heat dissipating device 740 of FIG. 7. In another example, if the arrangement of die 1320 and base 1790 in FIG. 19 is similar to or identical to the arrangement of die 120 and base 890 of FIG. 8, then method 1905 may use a heat dissipating device and a TIM similar to or identical to heat dissipating device 940 and TIM 945, respectively, of FIG. 9.

The above description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a substrate including an opening, the opening surrounded by a first edge, a second edge, a third edge, and a fourth edge;
   a first die, at least a portion of the first die occupying at least a portion of the opening;
   a second die coupled to the first die and directly coupled to the substrate such that at least a portion of the second die is located inside an opening in a base when the substrate is coupled to the base;
   a heat dissipating device coupled to the first die, wherein the first die includes a first side and a second side opposite the first side, the second die is on the first side of the first die, and the heat dissipating device is on the second side of the first die and coupled to the second side of the first die;
a thermal interface between the heat dissipating device and the second side of the first die, the thermal interface directly coupled to the heat dissipating device and directly coupled to the second side of the first die; and
electrical connections directly coupled to the second die and directly coupled to the substrate, the electrical connections surrounding the first, second, third, and fourth edges of the opening of the substrate.

2. The apparatus of claim 1, further comprising:
first electrical connections directly coupled to the first die and directly coupled to the second die.

3. The apparatus of claim 2, wherein the first electrical connections include solder directly contacting a side of the first die and directly contacting a side of the second die.

4. The apparatus of claim 2, wherein the second die includes a first side and a second side opposite from the first side, the first electrical connections are on the first side of the second die, and the second die includes no electrical connections on the second side of the second die.

5. The apparatus of claim 1, wherein the substrate is part of a ball grid array package.

6. An apparatus comprising:
a substrate including an opening; the opening surrounded by a first edge, a second edge, a third edge, and a fourth edge;
a first die, at least a portion of the first die occupying at least a portion of the opening;
a second die coupled to the first die and to the substrate such that at least a portion of the second die is located inside an opening in a base when the substrate is coupled to the base;
first electrical connections directly coupled to the first die and directly coupled to the second die;
second electrical connections directly coupled to the second die and directly coupled to the substrate;
a heat dissipating device coupled to the first die, wherein the first die includes a first side and a second side opposite the first side, the second die is on the first side of the first die, and the heat dissipating device is on the second side of the first die and coupled to the second side of the first die;
a thermal interface between the heat dissipating device and the second side of the first die, the thermal interface directly coupled to the heat dissipating device and directly coupled to the second side of the first die; and
additional electrical connections directly coupled to the substrate and directly coupled to the base, wherein the second electrical connections and the additional electrical connections are on a same side of the substrate, and the electrical connections surrounding the first, second, third, and fourth edges of the opening of the substrate.

7. The apparatus of claim 6, wherein the first and second electrical connections are on a same side of the second die.

8. An apparatus comprising:
a substrate including an opening, the opening surrounded by a first edge, a second edge, a third edge, and a fourth edge;
a first die, at least a portion of the first die occupying at least a portion of the opening; and
a second die coupled to the first die and directly coupled to the substrate;
a heat dissipating device coupled to the first die, wherein the first die includes a first side and a second side opposite the first side, the second die is on the first side of the first die, and the heat dissipating device is on the second side of the first die and coupled to the second side of the first die;
a thermal interface between the heat dissipating device and the second side of the first die, the thermal interface directly coupled to the heat dissipating device and directly coupled to the second side of the first die;
a base, the base including an opening, wherein at least a portion of the second die occupies at least a portion of the opening in the base; and
electrical connections directly coupled to the second die and directly coupled to the substrate, the electrical connections surrounding the first, second, third, and fourth edges of the opening of the substrate.

9. The apparatus of claim 8, wherein the opening of the base has a length greater than a length of the second die.

10. The apparatus of claim 8, further comprising an additional heat dissipating device, the additional heat dissipating device coupled to the second die through the opening in the base.

11. An apparatus comprising:
a substrate including an opening, the opening surrounded by a first edge, a second edge, a third edge, and a fourth;
a first die, at least a portion of the first die occupying at least a portion of the opening; and
a second die coupled to the first die and to the substrate;
a heat dissipating device coupled to the first die, wherein the first die includes a first side and a second side opposite the first side, the second die is on the first side of the first die, and the heat dissipating device is on the second side of the first die and coupled to the second side of the first die;
a thermal interface between the heat dissipating device and the second side of the first die, the thermal interface directly coupled to the heat dissipating device and directly coupled to the second side of the first die; and
a base, the base including an opening, wherein at least a portion of the second die occupies at least a portion of the opening in the base;
electrical connections directly coupled to the second die and directly coupled to the substrate; and
additional electrical connections directly coupled to the substrate and directly coupled to the base, wherein the electrical connections and the additional electrical connections are on a same side of the substrate, and the electrical connections surrounding the first, second, third, and fourth edges of the opening of the substrate.

12. An apparatus comprising:
a base;
a substrate coupled to the base, the substrate including an opening, the opening surrounded by a first edge, a second edge, a third edge, and a fourth edge;
a die, at least a portion of the die occupying at least a portion of the opening;
a structure coupled to the die through first electrical connections and directly coupled to the substrate through second electrical connections;
a heat dissipating device coupled to the die, wherein the die includes a first side and a second side opposite the first side, the first electrical connections are on the first side of the die, and the heat dissipating device is on the second side of the die and coupled to the second side of the die, wherein the base includes an opening, wherein at least a portion of the structure occupies at least a portion of the opening in the base; and a thermal interface between the heat dissipating device and the second side of the die, the thermal interface directly coupled to the heat dissipating device and directly coupled to the second side of the die; and additional electrical connections directly coupled to the substrate and directly coupled to the base, wherein the second electrical connections and the additional electrical connections are on a same side of the substrate, and the electrical connections surrounding the first, second, third, and fourth edges of the opening of the substrate.

13. The apparatus of claim 12, wherein the first electrical connections and the second electrical connections are on a same side of the structure.

14. The apparatus of claim 12, further comprising an additional heat dissipating device coupled to the structure through the opening in the base.

15. The apparatus of claim 12, wherein the base includes a printed circuit board.

16. The apparatus of claim 15, wherein the structure includes an interposer.

17. The apparatus of claim 15, wherein the structure includes an additional die.

18. The apparatus of claim 15, wherein at least one of the die and structure includes a processor.

19. A method comprising:
   attaching a combination of a first die and a second die to an assembly, such that at least a portion of the first die occupies at least a portion of an opening in a substrate of the assembly, the opening surrounded by a first edge, a second edge, a third edge, and a fourth edge, the first die and the second die coupled to each other by first electrical connections, wherein, the second die is directly attached to the substrate through second electrical connections such that the first electrical connections and the second electrical connections are on a same side of the second die and the second electrical connections surrounding the first, second, third, and fourth edges of the opening of the substrate, and such that at least a portion of the second die is located inside an opening in a base when the substrate is coupled to the base, and the second die is on a first side of the first die, wherein, attaching the combination of the first die and the second die to the assembly is performed such that a second side of the first die is coupled to a heat dissipating device of the assembly through a thermal interface material in the opening in the substrate, and the thermal interface material is between the heat dissipating device and the second side of the first die, the thermal interface material directly coupled to the heat dissipating device and directly coupled to the second side of the first die.

20. The method of claim 19, further comprising:
attaching the substrate to the base.

21. The method of claim 20, further comprising:
attaching an additional heat dissipating device to the second die through an opening in the base.

* * * * *